(12) United States Patent
Zhang et al.

(10) Patent No.: US 6,366,230 B1
(45) Date of Patent: Apr. 2, 2002

(54) PIPELINED ANALOG-TO-DIGITAL CONVERTER

(75) Inventors: Weibiao Zhang, Ames, IA (US); Donald C. Richardson, Plano; Richard Hester, McKinney, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/589,406

(22) Filed: Jun. 7, 2000

(51) Int. Cl.$^7$ ............................. H03M 1/34; H03M 1/12
(52) U.S. Cl. ..................... 341/162; 341/155; 341/161
(58) Field of Search ................... 341/120, 118, 341/161, 162, 155

(56) References Cited

U.S. PATENT DOCUMENTS

| | | | | |
|---|---|---|---|---|
| 5,499,027 A | * | 3/1996 | Karanicolas et al. | 341/120 |
| 5,572,212 A | * | 11/1996 | Levinson et al. | 341/162 |
| 5,594,445 A | * | 1/1997 | Ginetti | 341/162 |
| 5,631,650 A | * | 5/1997 | Hsu | 341/155 |
| 5,635,937 A | * | 6/1997 | Lim et al. | 341/161 |
| 5,657,019 A | * | 8/1997 | Hunt et al. | 341/120 |
| 5,668,549 A | * | 9/1997 | Opris et al. | 341/118 |
| 5,710,563 A | * | 1/1998 | Vu et al. | 341/161 |
| 5,821,893 A | * | 10/1998 | Kumamoto et al. | 341/161 |
| 5,861,832 A | * | 1/1999 | Nagaraj | 341/161 |
| 6,031,480 A | * | 2/2000 | Soenen et al. | 341/161 |
| 6,097,326 A | * | 8/2000 | Opris et al. | 341/161 |
| 6,169,502 B1 | * | 1/2001 | Johnson et al. | 341/120 |
| 6,177,899 B1 | * | 1/2001 | Hsu | 341/156 |
| 6,195,032 B1 | * | 2/2001 | Watson et al. | 341/162 |

OTHER PUBLICATIONS

U.S. Patent Application No. 09/371,416 entitled "Pipelined Analog–to–Digital Converter with Relaxed Inter–Stage Amplifier Requirements," filed Aug. 10, 1999; inventors Hester, Richard K, and Bright, William J.

Lewis et al., A 10–b 20–Msample / s Analog–to–Digital Converter; *IEEE Journal of Solid State Circuits*, vol. 27, No. 3, Mar. 1992, pp. 351–358.

* cited by examiner

*Primary Examiner*—Peguy JeanPierre
*Assistant Examiner*—Jean B Jeanglaude
(74) *Attorney, Agent, or Firm*—Pedro P. Hernandez; W. James Brady, III; Frederick J. Telecky, Jr.

(57) ABSTRACT

A pipelined analog-to-digital converter includes a first stage 700 of an analog-to-digital converter having a first resolution. The first stage 700 includes a three capacitor switched capacitor circuit. The analog-to-digital converter further includes one or more subsequent analog-to-digital converter stages 200. The first and subsequent stages 700 and 200 are pipelined together to provide a digital output signal.

23 Claims, 4 Drawing Sheets

PIPELINED ANALOG-TO-DIGITAL CONVERTER

The present invention is related to commonly-assigned U.S. patent application Ser. No. 09/371,416, filed Aug. 10, 1999, which is incorporate herein by reference as if repeated in its entirety.

FIELD OF THE INVENTION

This invention relates generally to semiconductor devices and systems and specifically to a pipelined analog-to-digital converter.

BACKGROUND OF THE INVENTION

Analog-to-digital conversion is the process of converting an analog signal, which is most commonly represented as voltage, into a digital format. Determining a digital value which represents a particular analog input is known as "quantization." Serial, delta-sigma or oversampling, parallel, and pipelined are some of the many different analog-to-digital conversion architectures which exist. Different architectures are suited to different needs.

The serial analog-to-digital architecture offers a wide range of performance in analog-to-digital conversion, from low power and low resolution to quantizations with very high resolutions. A serial architecture typically quantizes analog data at the rate of one bit per cycle. Therefore, a digital sample having N bits of resolution will take N cycles to fully quantize.

Delta-sigma analog-to-digital architecture is often used in audio signal processing. The architecture is designed to translate high-speed, low-resolution samples into higher-resolution, lower-speed output. This process is also referred to as oversampling because more samples of the analog data are quantized than actually become output.

By contrast, parallel analog-to-digital architecture provides the fastest quantization rate per analog signal. In the parallel (or "flash") architecture, a digital value per cycle is produced for each analog data sample, without regard to N, the number of bits of resolution. Parallel architecture requires that all quantization levels be simultaneously compared to the analog signal. This results in the use of $2^{N-1}$ comparators and $2^{N+1}$ resistors to achieve a digital value, with N bits of resolution, per cycle.

Pipelined analog-to-digital architecture, like serial analog-to-digital architecture, is a method of quantizing an analog signal in stages. Algorithms exist for obtaining either 1 or 1.5 bits of resolution per stage. In a 1.5-bit per stage converter, the digital output of each stage is either 1, 0, or −1. In a 1-bit per stage converter, the digital output of each stage is either 1 or −1 (or 1 or 0). For either algorithm, N stages are used for an N-bit digital value. One bit is resolved at each stage with the result and analog signal sample passed along to the next stage for resolution of another bit.

In a 1.5 bit per stage converter, the other ½ bit in each stage is redundant. Digital correction logic eliminates the redundancy to produce an N-bit result. Producing a single digital value for a single analog input requires N cycles, one for each stage. However, the pipelining permits a high degree of parallelism, so that one output per cycle can be produced after the pipeline fills up.

SUMMARY OF THE INVENTION

Related co-pending patent application 09/371,416 discloses a pipelined analog-to-digital converter with relaxed inter-stage amplifier requirements. In one aspect, the present invention provides a number of implementations of a circuit that meets the criteria of the co-pending application.

For example, in one embodiment a pipelined analog-to-digital converter includes a first stage of an analog-to-digital converter having a first resolution. The first stage includes a three capacitor switched capacitor circuit. The analog-to-digital converter further includes one or more subsequent analog-to-digital converter stages. Each of the subsequent stages has a second resolution which is coarser than the first resolution. The first and subsequent stages are pipelined together to provide a digital output signal.

In another embodiment, an analog-to-digital converter includes multiple stages. The first stages includes at least three comparators. A decoder is coupled to each of the comparators and provides an output that is related to the magnitude of an analog input signal. A switched capacitor circuit receives the analog input signal and a variable reference voltage, the magnitude of which is selected by the decoder. The switched capacitor circuit also provides a residue signal. A second stage has an input coupled to the switched capacitor circuit output of the first stage. This second includes a sub-analog-to-digital converter that is configured to quantize the residue signal. Third and subsequent stages may also be included.

One advantage of certain embodiments of the present invention is the reduction of the signal swing of inter-stage amplifiers by a factor of two. Such a reduction can be significant when low power supply voltages limit the output range of an operational amplifier. Another advantage of certain of these embodiments is the simplification of the sub-digital-to-analog operation by reducing the required range of the reference voltage $V_{REF}$ and reducing the number of components that must accurately match in order to generate required fractions of $V_{REF}$.

BRIEF DESCRIPTION OF THE DRAWINGS

The above features of the present invention will be more clearly understood from consideration of the following descriptions in connection with accompanying drawings in which:

FIGS. 2b and 2c are the quantization law and a residual voltage plot of the circuit of FIG. 2a;

DETAILED DESCRIPTION OF ILLUSTRATIVE EMBODIMENTS

The making and use of the various embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

In one aspect, the present invention describes a scheme that will be used to implement a high-accuracy pipelined analog-to-digital converter (ADC) with relaxed inter-stage amplifier requirements. Compared with other possible alternatives, this scheme has the advantage of more accuracy without compromising bandwidth of the operational amplifier.

Figure 1:
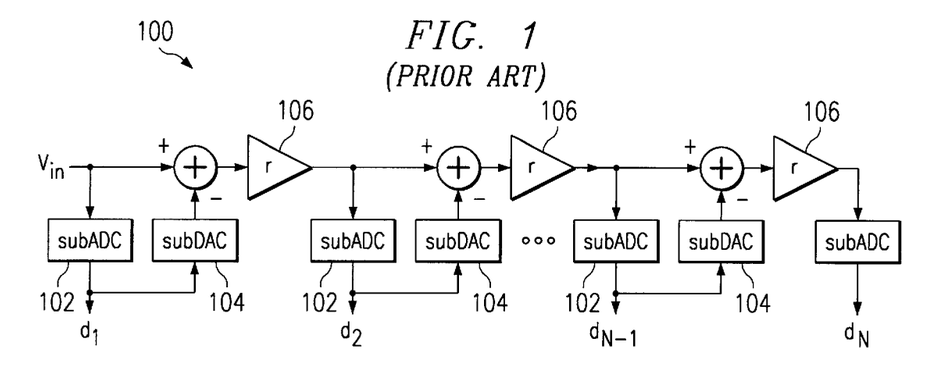
FIG. 1 is a block diagram of a known pipelined analog-to-digital converter.

Before describing the preferred embodiments of the present invention, however, it will be informative to review previously developed schemes. For example, a traditional pipeline ADC architecture 100 is shown in FIG. 1. This device is constructed by N identical stages, each of which resolve debits. Each stage includes a $d_i$ bit(s) flash sub-ADC 102, a sub-DAC 104 and a residue amplifier 106. By arranging the elements in this way, power consumption is drastically reduced comparing with direct flash architecture.

Sub-ADC 102 is a low resolution analog-to-digital converter. Each sub-ADC performs a coarse conversion of its analog input signal to a digital approximation that is used to build the final digital ADC output. The sub-ADC 102 output is reconverted to an analog signal by sub-DAC 104 and subtracted from the sub-ADC 102 input by subtraction circuit 108. The inter-stage amplifier 106 multiplies this difference by a factor r. The amplifier output is expressed by:

$$V_{RES} = r(V_{IN} - d\, V_{REF}) \quad (1)$$

where d represents the output of the sub-ADC 202. The multiplication factor r, that is the gain of amplifier 106, is often referred to as the converter radix. A radix of 2 is common for analog-to-digital converter stages of 1 or 1.5 bits per stage since this allows the components of each stage to be substantially identical.

The analog output of each stage is referred to as its residue $V_{RES}$. The digital output of the overall ADC 100 is constructed by combining the outputs d from each of the sub-ADC stages.

The particular design choice of the sub-ADC 102 does not necessarily affect the accuracy of the overall ADC. However, the design choice can have a significant affect on the residue signal. This effect on the residue can make optimal performance of the inter-stage amplifier 106 difficult to achieve. The parameters incorporated in the design of a sub-ADC 202 include its output codes $\{d_1, d_2, d_3, \ldots, d_N\}$ and the transition voltages necessary to produce the output codes.

A modification of the traditional pipelined ADC architecture is described by S. Lewis et al., "A 10-b 20-Msample/s Analog-to-Digital Converter," IEEE Journal of Solid State Circuits, Vol. 27, No. 3, March 1992, pp. 351–358, incorporated herein by reference. This architecture reduces the number of comparators and shifts their decision points in each stage except the last one. By doing this, redundancy is introduced, and a simple digital-error-correction algorithm is applied to the digital outputs of all the stages. This architecture further reduces the power consumption and relaxes requirements on the offsets of comparators. As a result, this architecture is quite popular in a number of systems.

Figure 2A:
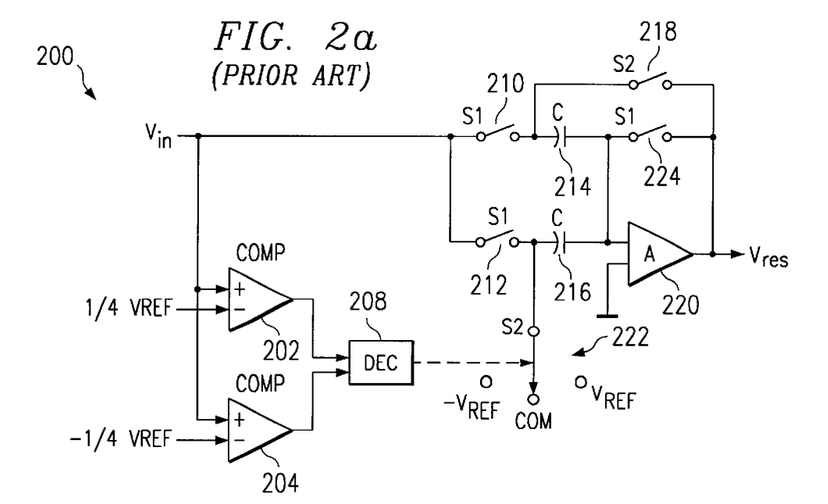
FIG. 2a is a portion of one stage of a conventional ADC.

FIG. 2a shows the circuit diagram of one stage of the pipelined ADC. The analog input signal $V_{IN}$ is applied to two comparators 202 and 204, along with reference voltages ¼$V_{REF}$ and −¼$V_{REF}$. The comparator outputs are applied to decoder 208. The input signal $V_{IN}$ is also applied to two switches 210 and 212, each of which is coupled to an associated capacitor 214 and 216. In FIG. 2, as with the other figures, the two kinds of switches labeled $S_1$ and $S_2$ are controlled by two-phase clock signals. During phase one, all switches labeled $S_1$ are turned on and those labeled $S_2$ are off. Similarly, during the second phase, all switches labeled $S_1$ are turned off and those labeled $S_2$ are on.

In the preferred embodiments (e.g., see FIGS. 2, 4–8), each of the switches is formed from a transistor such as a field effect transistor (e.g., n-channel or p-channel) or a combination of transistors such as a CMOS transmission gate. Other switches, such as bipolar transistors as an example, can alternatively be used.

During the first phase, the input voltage $V_{IN}$ is sampled across capacitors 214 and 216. During the second phase, the residual voltage $V_{RES}$ is generated by unity gain amplifier 220 by closing switch 218 and applying the appropriate reference voltage through switch 222.

Figure 2B:
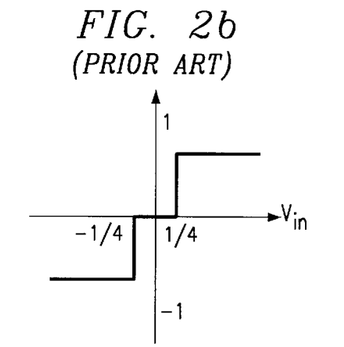
Figure 2C:
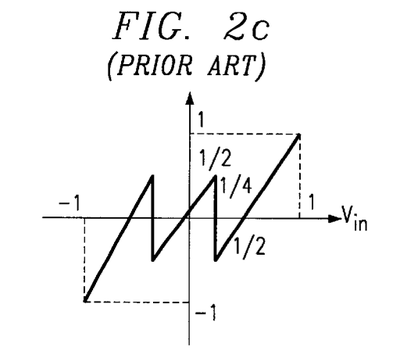

This ADC 200 has three output codes $\{-1, 0, 1\}$, associated with voltage levels $-V_{REF}$, COM and VREF in FIG. 2a, and two transition points $\{-¼, ¼\}$, noted by voltages $-V_{REF}/4$ and $V_{REF}/4$. This type of sub-ADC is typically used in CMOS pipelined ADC products. FIG. 2b graphically depicts the quantization law of this two-comparator sub-ADC. FIG. 2c graphically depicts the residue voltage corresponding to the quantization law of the sub-ADC. In both FIGS. 2b and 2c the axes have been normalized for a $V_{REF}$ of 1. (Accordingly, throughout this patent a level without any mention of a voltage is considered to be relative to $V_{REF}$. For example, in this nomenclature a transition voltage of ¼ is the same as a transition voltage of $V_{REF}/4$.)

As shown in FIGS. 2b and 2c, the residue for one stage is high when the input is approaching $+/-V_{REF}$. The next stage amplifier should be settled to a specified accuracy within specified time interval. As a matter of fact, when the input approaches to − or $+V_{REF}$, in many cases, the amplifier open loop gain is reduced comparing with lower input, as a result, more error will be generated in the residue. The error will further propagate down through the pipeline and accumulate. This imposes high requirements on amplifier performance, such as dc gain and settling time.

A new approach is proposed in co-pending application Ser. No. 09/371,416 (TI-27167), incorporated herein by reference. That patent application discloses a pipelined analog-to-digital converter (ADC) architecture that reduces the signal swing of the inter-stage amplifier by a factor of two. The present invention provides, among other things, practical implementations of this type of ADC. Preferably, the first stage of an N stage pipelined ADC is a three-comparator stage sub-ADC. The successive N−1 stages of the pipelined ADC are each preferably common two-comparator stage sub-ADCs. The nominal residue voltage of the first sub-ADC does not exceed $V_{REF}/2$. As input to the next successive sub-ADC, the nominal residue voltage limits the residue error to $\pm V_{REF}/2$. Therefore, the residue error is not propagated and accumulated at each successive sub-ADC stage in the pipeline.

The preferred embodiment pipelined ADCs disclosed in the co-pending application and herein require no more hardware than a traditional two-comparator stage pipelined ADC, which has as its last stage, a three-comparator sub-ADC. Consequently, these disclosed pipelined ADCs also require no additional power consumption over a traditional two-comparator stage pipelined ADC. An advantage of the preferred embodiment of the invention is the reduction of the signal swing of inter-stage amplifiers by a factor of two. Such a reduction is significant when low power supply voltages limit the output range of operational amplifier.

Figures 3A, 3B, 4:
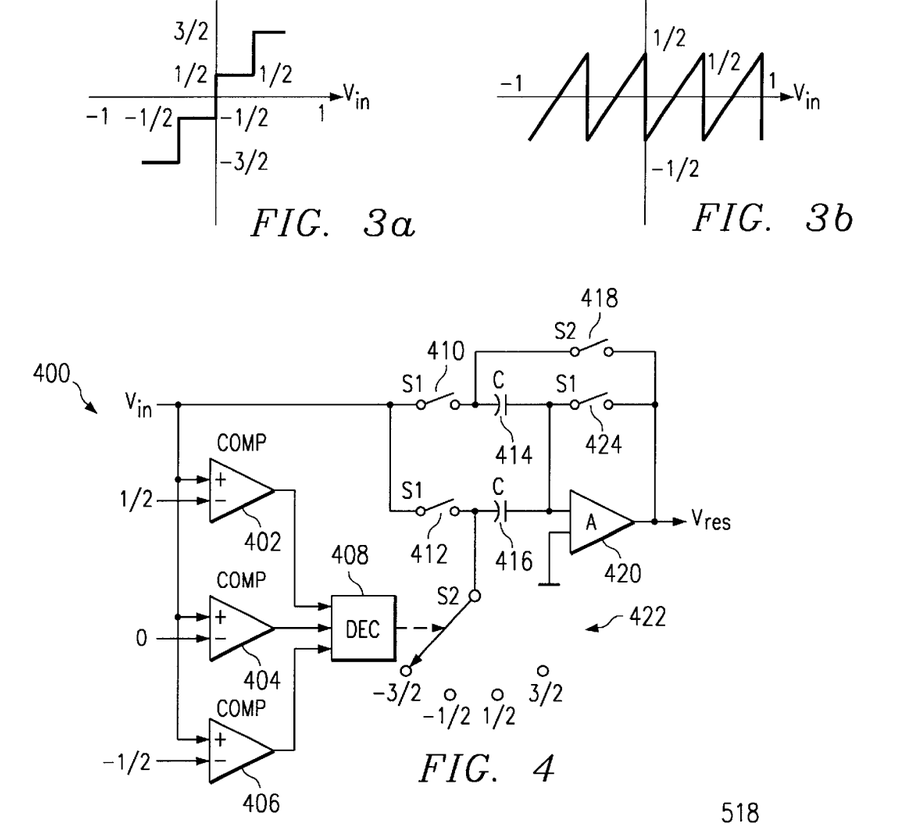
FIGS. 3a and 3b are the quantization law and a residual voltage plot of the circuit of a first stage of a pipelined ADC of the present invention.
FIG. 4 is a circuit diagram of a first embodiment circuit of the present invention.

FIGS. 3a and 3b show the quantization law and the corresponding radix-2 residue magnitude. In the co-pending and present applications, a first embodiment ADC includes a first stage where the transition voltages are $\{-\frac{1}{2}, 0, \frac{1}{2}\}$, i.e., $\{-V_{REF}/2, 0, V_{REF}/2\}$, and the sub-DAC output codes are $\{-\frac{3}{2}, -\frac{1}{2}, \frac{1}{2}, \frac{3}{2}\}$. The residue magnitude is within $V_{REF}/2$ as long as the input is within $\pm V_{REF}$. Subsequent stages can employ the common two-comparator architecture of FIG. 2. The total number of the comparators is the same as that of Lewis's architecture since one more comparator is used in the first stage but one less is used at the end of the pipeline.

Assuming a radix of two (r=2), the residue of the first stage can be represented by the following formula:

$$V_{RES} = 2 * V_{IN} - V_{DACi} \quad (2)$$

where i=0, 1, 2, 3 and where $V_{DAC0} = -1.5 * V_{REF}$
$V_{DAC1} = -0.5 * V_{REF}$
$V_{DAC2} = 0.5 * V_{REF}$
$V_{DAC2} = 1.5 * V_{REF}$.

The residue of the following stages are represented by:

$$V_{RES} = 2 * V_{IN} - V_{DACi} \quad (3)$$

where i=0,1,2, and where $V_{DAC0} = -V_{REF}$
$V_{DAC1} = 0$
$V_{DAC2} = VREF$

From an implementation point of view, formula (3) is the same as the architecture shown in FIG. 2 and therefore the implementation of later stages is the same as with present systems. See FIG. 8. For example, each of the later stages could be implemented using a circuit as shown in FIG. 2. But for the first stage, formula (2) can have several different implementations.

A first embodiment implementation uses a two-capacitor switched capacitor circuit as shown in FIG. 4. For simplicity, a single ended circuit is illustrated for each of the inventions embodiments (e.g., FIGS. 2, and 4–8) even though differential circuits are preferred for use in commercial implementations.

Sub-ADC 400 includes three comparators 402, 404, 406 which receive reference voltages $V_{REF}/2$, 0 (or common), and $-V_{REF}/2$. These comparators 402, 404, 406 determine the most significant bits of the digital result by comparing the reference voltages with the analog input voltage $V_{IN}$. Decoder 408 is used to select the reference voltage $V_{DAC}$ based on the comparisons. In this case, $V_{DAC}$ is one of $\{-3V_{REF}/2, -V_{REF}/2, V_{REF}/2, 3V_{REF}/2\}$. The switched capacitor circuit including amplifier 420, switches 410, 412, 418, 422 and 424 and capacitors 414 and 416 can then be used to generate the residual voltage $V_{RES}$.

This embodiment is less preferred than other embodiments because it includes references that have values greater than $V_{REF}$. To derive these reference values, additional circuitry such as a charge pump or level translator can be used. The circuit has another disadvantage since $V_{REF}/2$ will normally be obtained from resistor string that has matching limitation.

Formula (2) can also be written as $$V_{RES} = 2 (V_{IN} - V_{DACi}/2) \quad (4)$$

Figure 5:
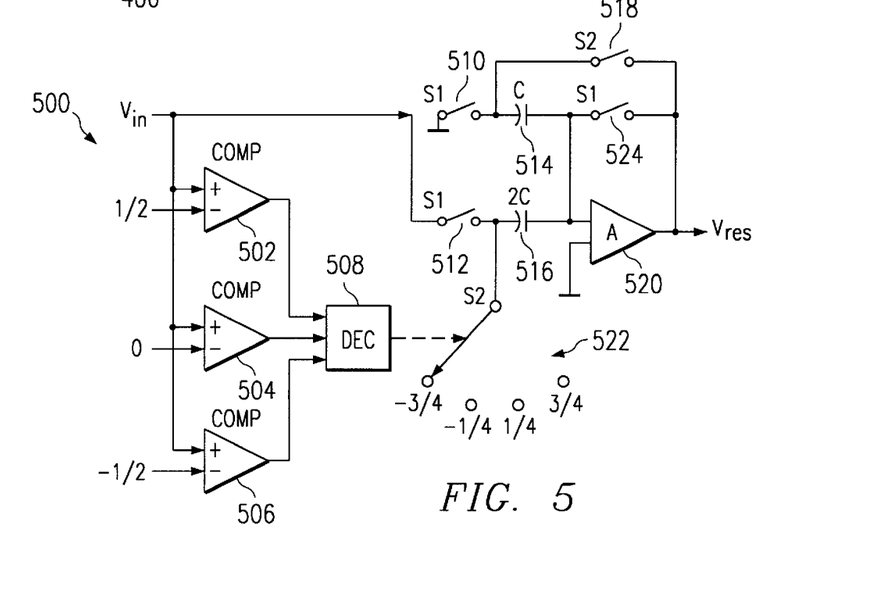
FIG. 5 is a circuit diagram of a third embodiment circuit of the present invention.

This leads to the second alternative embodiment 500, which is shown in FIG. 5.

The circuit of FIG. 5 is similar to that of FIG. 4 except that capacitor 516 has a capacitance that is twice that of capacitor 514. By doubling this capacitance value, the value of each of the reference voltages selected by decoder 508 can be halved. This adjustment leads to reference voltages $V_{DAC}$ that is one of $\{-3V_{REF}/4, -V_{REF}/4, V_{REF}/4, 3V_{REF}/4\}$, thereby solving the issues with regard to having voltages greater than $V_{REF}$ that exist in the implementation of FIG. 4.

It is noted that the switch 510 is coupled to ground rather than VIN as in FIG. 4. In FIG. 4, $V_{IN}$ is sampled onto capacitors 414 and 416 (C+C=2C) of capacitance. In FIG. 5, in order for the gain of $V_{IN}$ to be correct relative to that of the sub-DAC, $V_{IN}$ must likewise only be sampled onto the 2C capacitor 516.

Unfortunately, this scheme is not ideal either since some bandwidth of the amplifier 520 is sacrificed, since the phase 2 gain is two. This gain is higher than the commonly used two-capacitor switched capacitor circuit, where the phase 2 gain is one. Furthermore, the $V_{DACi}/2$ points are normally obtained from resistor string, which has the same limitation as the circuit of FIG. 4.

Figure 6:
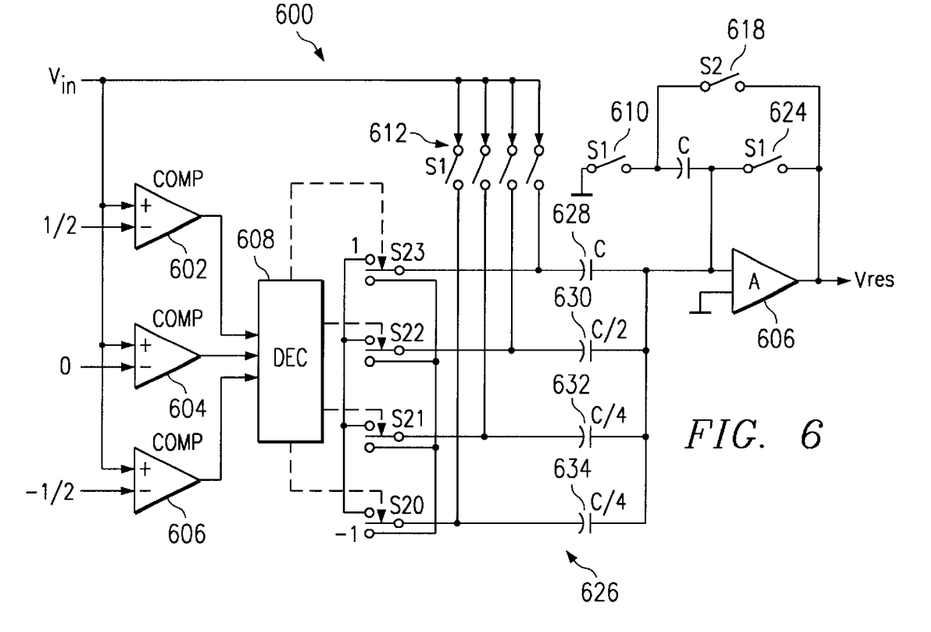
FIG. 6 is a circuit diagram of a third embodiment circuit of the present invention.

A third alternative embodiment 600 is shown in FIG. 6. In this case, $V_{DAC}/2$ is generated using a capacitor array 626 that includes capacitors 628–634. Capacitor array 626 only connects to $V_{REF}$ or $-V_{REF}$ rather than to a resistor string. By doing this, the $V_{DAC}$ references coming out from resistor string are avoided. In other words, the voltage division is performed through the capacitors of array 626 rather than a resistor string (not shown). Typically capacitors are preferred over a resistor string because better component matching can typically be obtained with capacitors than with resistors. Also, it is noted that the comparator thresholds $\{-\frac{1}{2}, 0, +\frac{1}{2}\}$ do not require as much accuracy because of the redundancy and error correction in the pipeline.

This embodiment 600 is preferred over the two previously described embodiments. In this embodiment the four capacitors 628–634 should be matched so that the capacitance of capacitor 628 is about twice that of capacitor 630 and the capacitance of capacitor 630 is about twice that of capacitors 632 and 634. In order to achieve high accuracy, the capacitors need to be very accurate and trimming is often necessary. In the preferred embodiment, these capacitors 628–634 are trimmed using fuses (not shown) that adjust the capacitance as determined by testing. Other trimming techniques are also possible.

Figure 7:
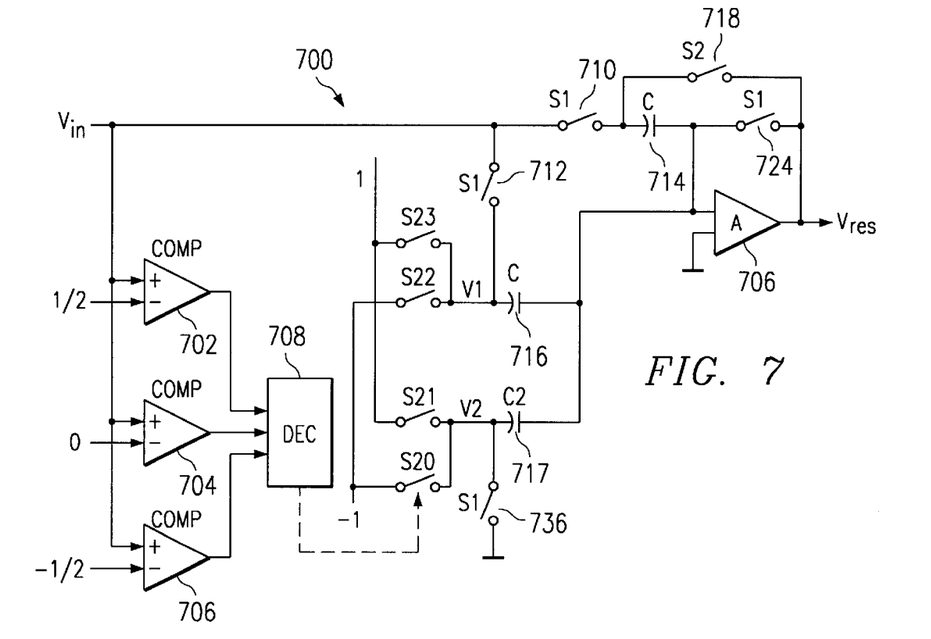
FIG. 7 is a circuit diagram of a fourth embodiment circuit of the present invention.

A fourth and most preferred embodiment is the three-capacitor switched-capacitor circuit 700 shown in FIG. 7. This circuit includes three comparators 702–706 and decoder 708 as in each of the other embodiments. During phase 1, where all switches labeled $S_1$ are turned on and those labeled $S_2$ are off, the analog input voltage $V_{IN}$ is sampled to the capacitors 714 and 716 and the common mode voltage is sampled on capacitor 717 via switch 736. In this embodiment, the capacitance of capacitor 716 is equal to the capacitance of capacitor 714 and the capacitance of capacitor 717 is half of the capacitance of capacitors 714 and 716.

During phase two, where all switches labeled $S_2$ are turned on and those labeled $S_1$ are turned off, capacitor 714 is coupled to the output node $V_{RES}$ while capacitors 716 and 717 are coupled to one of the reference nodes $V_{REF}$ or $-V_{REF}$ as determined by the digital codes of the sub-DAC. In this particular implementation, the decoder 708 output will control whether $V_{REF}$ or $-V_{REF}$ will be coupled to capacitors 716 and 717. This determination is shown in Table 1.

TABLE 1

Control Table (During Phase 2)

| $V_{IN}$ | $S_{23}$ | $S_{22}$ | $S_{21}$ | $S_{20}$ | $V_1$ | $V_2$ |
|---|---|---|---|---|---|---|
| $-1 < V_{IN} < -\frac{1}{2}$ | OFF | ON | OFF | ON | $-1$ | $-1$ |
| $-\frac{1}{2} < V_{IN} < 0$ | OFF | ON | ON | OFF | $-1$ | $1$ |
| $0 < V_{IN} < \frac{1}{2}$ | ON | OFF | OFF | ON | $1$ | $-1$ |
| $\frac{1}{2} < V_{IN} < 1$ | ON | OFF | ON | OFF | $1$ | $1$ |

This embodiment has a number of advantages. The phase 2 gain of the amplifier 720 is one and therefore less amplifier bandwidth is sacrificed compared to embodiments where the phase 2 gain is greater than one. In addition, the capacitors are not required to connect to the voltages coming from a resistor string. Further, the number of matched capacitors is reduced in comparison with the embodiment of FIG. 6.

One key in this embodiment of the invention is the combination of the two-capacitor switched capacitor circuit with another capacitor to realize the first stage residue amplifier required for pipelined ADC with relaxed requirement of amplifier. By doing this, the bandwidth of the amplifier is not sacrificed. The scheme also takes advantage of directly connecting VREF or −VREF sources to the sampling capacitors, this allows it to have more precise sub-DAC references and less error in the residue signal fed to the second stage. In differential embodiments, the common mode voltage shown here as sampled onto capacitor 717 via switch 736 is obtained by shorting together the two differential inputs so as to accurately obtain a differential input voltage of zero.

Figure 8:
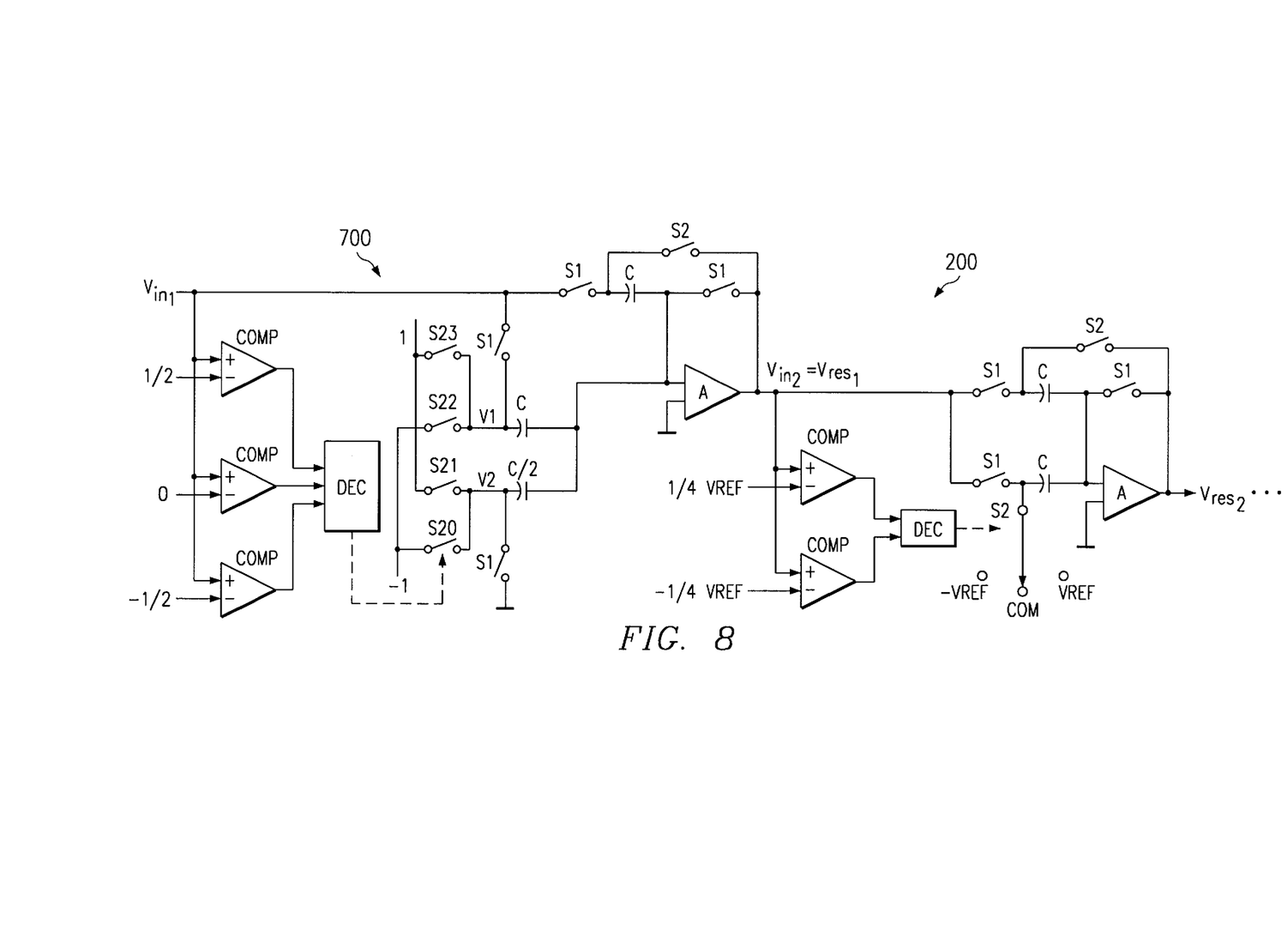
FIG. 8 is a circuit diagram of the first two stages of a preferred embodiment ADC.

FIG. 8 illustrates the first two stages of a preferred embodiment ADC. A typical ADC might include between about 8 to 16 stages. In the preferred embodiment, each stage beyond the first will be substantially the same as the second stage.

In this example, the first stage is the same as the fourth embodiment as shown in FIG. 7. It is noted, however, that this first stage could just have easily been any of the circuits from FIGS. 4, 5 or 6. The second (and later) stage is taken from the embodiment illustrated in FIG. 2. As noted on FIG. 8, the input of the second stage is coupled to the output of the first stage.

A pipelined analog-to-digital converter of the present invention can be used in many applications. These devices are particularly useful when high speed, high resolution quantization is required. The pipelined analog-to-digital conversion architecture's ability to meet these demands makes it ideal for high volume telecommunications application such as various digital subscriber lines, digital signal processing at video rates, and for stand alone high speed analog-to-digital converters.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An analog-to-digital converter comprising:

a first stage comprising:

at least three comparators, each comparator having inputs coupled to a respective transition voltage node and an analog input signal node;

a decoder coupled to outputs of each of the comparators, the decoder including at least one output that is related to the magnitude of an analog input signal carried at the analog input signal node;

a switched capacitor circuit including a first input coupled to receive the analog input signal and a second input coupled to receive a variable reference voltage the magnitude of which is selected by the at least one decoder output, the switched capacitor circuit also including an output for carrying a residue signal;

a second stage with an input coupled to the switched capacitor circuit output of the first stage, the second stage comprising an sub-analog-to-digital converter configured to quantize the residue signal.

2. The analog-to-digital converter of claim 1 wherein the switched capacitor circuit includes at least three capacitors.

3. The analog-to-digital converter of claim 2 wherein the switched capacitor circuit includes three capacitors.

4. The analog-to-digital converter of claim 3 wherein the three capacitors comprises a first capacitor, a second capacitor and a third capacitor, and wherein:

the first capacitor is coupled between a first reference node and a first input of an amplifier;

the second capacitor is coupled between a second reference node and the first input of the amplifier; and the third capacitor is coupled between the analog input signal node and the first input of the amplifier.

5. The analog-to-digital converter of claim 4 wherein the capacitance of the second capacitor is about half of the capacitance of the first capacitor.

6. The analog-to-digital converter of claim 4 wherein the first reference node carries a reference voltage equal to one of +1 or −1 depending on the at least one decoder output and the second reference node carries a reference voltage equal to one of +1 or −1 depending on the at least one decoder output.

7. The analog-to-digital converter of claim 6 and further comprising:

a first switch with a current path coupled between a +1 reference node and the first reference node, the first switch being controlled by a first decoder output;

a second switch with a current path coupled between a −1 reference node and the first reference node, the second switch being controlled by a second decoder output;

a third switch with a current path coupled between the +1 reference node and the second reference node, the third switch being controlled by a third decoder output; and a fourth switch with a current path coupled between the −1 reference node and the second reference node, the fourth switch being controlled by a fourth decoder output.

8. The analog-to-digital converter of claim 7 wherein each of the first through fourth switches is conductive based on the magnitude of the analog input signal ($V_{IN}$) as follows:

when $-1<V_{IN}<-\frac{1}{2}$, the first and third switches are non-conductive and the second and fourth switches are conductive;

when $-\frac{1}{2}<V_{IN}<0$, the first and fourth switches are non-conductive and the second and third switches are conductive;

when $0<V_{IN}<\frac{1}{2}$, the first and fourth switches are conductive and the second and third switches are non-conductive; and when $\frac{1}{2}<V_{IN}<1$, the first and third switches are conductive and the second and fourth switches are non-conductive.

9. The analog-to-digital converter of claim 2 wherein the at least three capacitors comprise first, second, third and fourth capacitors, and wherein the capacitance of the first capacitor is about twice the capacitance of the second capacitor and the capacitance of the second capacitor is about twice the capacitance of the third capacitor.

10. The analog-to-digital converter of claim 9 and further comprising four switches, each of the switches coupled between a respective one of the capacitors and one of a +1 reference node or a −1 reference node, each switch having a conductivity that is controlled by the at least one decoder output.

11. The analog-to-digital converter of claim 1 wherein the switched capacitor circuit comprises a two capacitor switched capacitor circuit.

12. The analog-to-digital converter of claim 11 wherein the reference voltage that is selected by the at least one decoder output is one of $\{-3/2, -1/2, 1/2, 3/2\}$.

13. The analog-to-digital converter of claim 11 wherein the two capacitors comprise a first capacitor, a second capacitor, and wherein:
the first capacitor is coupled between a reference node and a first input of an amplifier; and
the second capacitor is coupled between the analog input signal and the first input of the amplifier.

14. The analog-to-digital converter of claim 13 wherein the capacitance of the first capacitor is substantially the same as the capacitance of the second capacitor.

15. The analog-to-digital converter of claim 11 wherein a first one of the two capacitors has a capacitance that is about twice that of the second one of the two capacitors.

16. The analog-to-digital converter of claim 15 wherein the reference voltage that is selected by the at least one decoder output is one of $\{-3/4, -1/4, 1/4, 3/4\}$.

17. The analog-to-digital converter of claim 1 wherein the at least three comparators include a first comparator, a second comparator and a third comparator, and wherein:
the first comparator receives a transition voltage that is substantially equal to about $1/2$;
the second comparator receives a transition voltage that is substantially equal to about 0; and
the third comparator receives a transition voltage that is substantially equal to about $-1/2$.

18. A circuit comprising:
a first comparator with a first input coupled to an input signal node and a second input coupled to a first transition voltage node;
a second comparator with a first input coupled to an input signal node and a second input coupled to a second transition voltage node;
a third comparator with a first input coupled to an input signal node and a second input coupled to a third transition voltage node;
a decoder having a first input coupled to an output of the first comparator, a second input coupled to an output of the second comparator and a third input coupled to an output of the third comparator, the decoder further including first, second, third, and fourth outputs;
a first switch with a current path coupled between a +1 reference node and a first plate of a first capacitor, the first switch being controlled by the first decoder output;
a second switch with a current path coupled between a −1 reference node and the first plate of the first capacitor, the second switch being controlled by the second decoder output;
a third switch with a current path coupled between the +1 reference node and a first plate of a second capacitor, the third switch being controlled by the third decoder output;
a fourth switch with a current path coupled between the −1 reference node and the first plate of the second capacitor, the fourth switch being controlled by the fourth decoder output;
a fifth switch coupled between the first plate of the first capacitor and the input signal node;
a sixth switch coupled between the input signal node and a first plate of a third capacitor;
an amplifier with a first input coupled to a second plate of the first capacitor, to a second plate of the second capacitor and a second plate of the third capacitor;
a seventh switch coupled between the first plate of the third capacitor and an output of the amplifier;
an eighth switch coupled between the second plate of the third capacitor and the output of the amplifier; and
a ninth switch coupled between the first plate of the second capacitor and a ground reference node.

19. A pipelined analog-to-digital converter comprising:
a first stage of an analog-to-digital converter having a first resolution, the first stage including a three capacitor switched capacitor circuit;
the three capacitor switched capacitor circuit includes a first capacitor, a second capacitor and a third capacitor, and the first capacitor is coupled between a first reference node and a first input of an amplifier, and the second capacitor is coupled between a second reference node and the first input of the amplifier, and the third capacitor is coupled between the analog input signal node and the first input of the amplifier;
one or more subsequent analog-to-digital converter stages, the first and subsequent stages being pipelined together to provide a digital output signal;
a first switch with a current path coupled between a +1 reference node and the first reference node, the first switch being controlled by a first decoder output;
a second switch with a current path coupled between a −1 reference node and the first reference node, the second switch being controlled by a second decoder output;
a third switch with a current path coupled between the +1 reference node and the second reference node, the third switch being controlled by a third decoder output; and
a fourth switch with a current path coupled between the −1 reference node and the second reference node, the fourth switch being controlled by a fourth decoder output; and the first reference node carries a reference voltage equal to one of +1 or −1 depending on one of said first, second, third or fourth decoder outputs and the second reference node carries a reference voltage equal to one of +1 or −1 depending on one of said first, second, third or fourth decoder outputs.

20. The analog-to-digital converter of claim 19 wherein each of the first through fourth switches is conductive based on the magnitude of the analog input signal ($V_{IN}$) as follows:
when $-1<V_{IN}<-1/2$, the first and third switches are non-conductive and the second and fourth switches are conductive;
when $-1/2<V_{IN}<0$, the first and fourth switches are non-conductive and the second and third switches are conductive;

when $0<V_{IN}<½$, the first and fourth switches are conductive and the second and third switches are nonconductive; and when $½<V_{IN}<1$, the first and third switches are conductive and the second and fourth switches are nonconductive.

21. The analog-to-digital converter of claim 19 wherein the capacitance of the second capacitor is about half of the capacitance of the first capacitor.

22. The analog-to-digital converter of claim 19 wherein the first stage has output codes that are not integrally related to output codes of the subsequent stages and all of the output codes contribute to form a digital value.

23. The analog-to-digital converter of claim 19 Wherein the one or more subsequent stages each have a second resolution which is coarser than the first resolution.

* * * * *